United States Patent [19]

Jones et al.

[11] Patent Number: 5,435,885
[45] Date of Patent: Jul. 25, 1995

[54] APPARATUS AND METHOD FOR FLUID PROCESSING OF ELECTRONIC PACKAGING WITH FLOW PATTERN CHANGE

[75] Inventors: Jeffrey D. Jones, Newark Valley; Robert H. Katyl, Vestal; Thomas L. Miller, Vestal; Oscar A. Moreno, Vestal, all of N.Y.

[73] Assignee: International Business Machines Corporation, Armonk, N.Y.

[21] Appl. No.: 186,454

[22] Filed: Jan. 25, 1994

[51] Int. Cl.⁶ .............................. B44C 1/22
[52] U.S. Cl. .................. 216/92 W; 156/345; 134/34; 134/64 R; 134/122 R; 134/198
[58] Field of Search ............ 156/345, 640, 642; 134/34, 64 R, 122 R, 172, 198, 199

[56] References Cited

U.S. PATENT DOCUMENTS

| | | | |
|---|---|---|---|
| 3,689,333 | 8/1970 | Hillhouse | 156/345 X |
| 3,891,491 | 6/1975 | Lerner | 156/345 |
| 3,958,587 | 5/1976 | Brown | 138/198 |
| 4,055,302 | 11/1977 | Hruby et al. | 239/102 |
| 4,174,261 | 11/1979 | Pellegrino | 204/273 |
| 4,371,422 | 1/1983 | Eidschun | 156/640 |
| 4,662,976 | 5/1987 | Hollmuller | 156/345 |
| 4,802,508 | 2/1989 | Styles et al. | 137/624.13 |
| 4,985,111 | 1/1991 | Ketelhohn | 156/640 |
| 5,063,951 | 11/1991 | Bard et al. | 134/64 R |
| 5,071,508 | 12/1991 | Scheithauer et al. | 156/627 |
| 5,310,440 | 5/1994 | Zingher | 156/345 |

FOREIGN PATENT DOCUMENTS

| | | |
|---|---|---|
| 0076878 | 5/1984 | Japan . |
| 0076879 | 5/1984 | Japan . |
| 0093881 | 5/1984 | Japan . |
| 63-28453 | 8/1989 | Japan . |
| 2153081 | 6/1990 | Japan . |

Primary Examiner—William Powell
Attorney, Agent, or Firm—Pollock, Vande Sande & Priddy

[57] ABSTRACT

A fluid treatment apparatus including a first fluid flow manifold having at least one fluid head positioned on a first side of a surface of a substrate to be treated by a fluid. The first fluid flow manifold includes at least two sets of a plurality of fluid jet injectors formed therein and apparatus for directing a fluid into the fluid jet injectors. Each of the fluid jet injectors creates a fluid jet impinging upon the surface of the substrate. Apparatus is interconnected with the first fluid flow manifold for supplying fluid to the fluid injector jets. Apparatus connected between the supply apparatus and the first fluid flow manifold alternates a flow of the fluid through the sets of fluid jet injectors. A fluid source is connected to the fluid supplying apparatus.

36 Claims, 14 Drawing Sheets

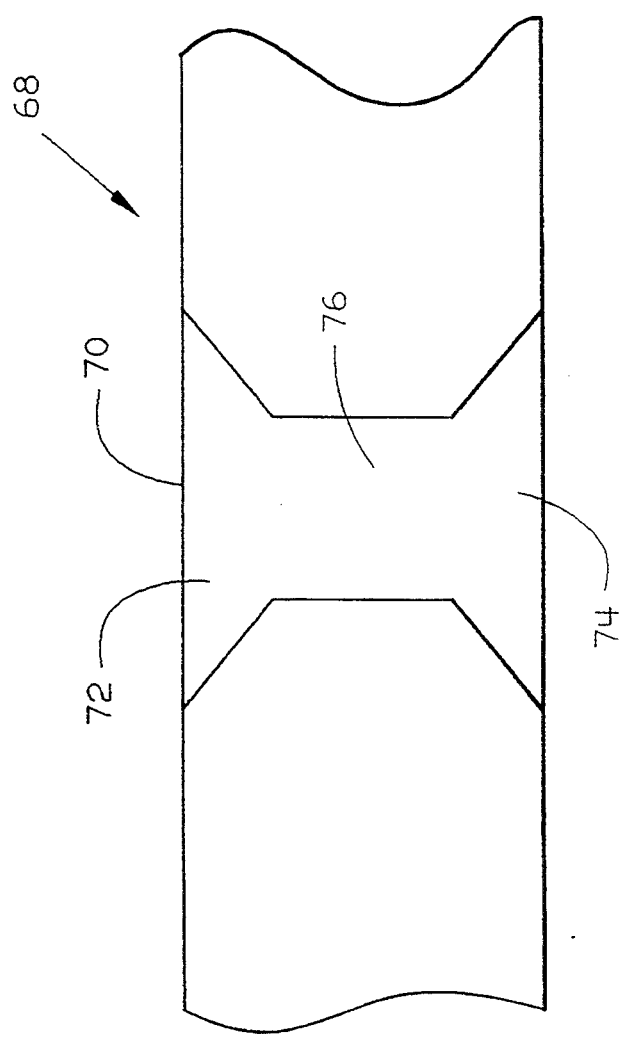

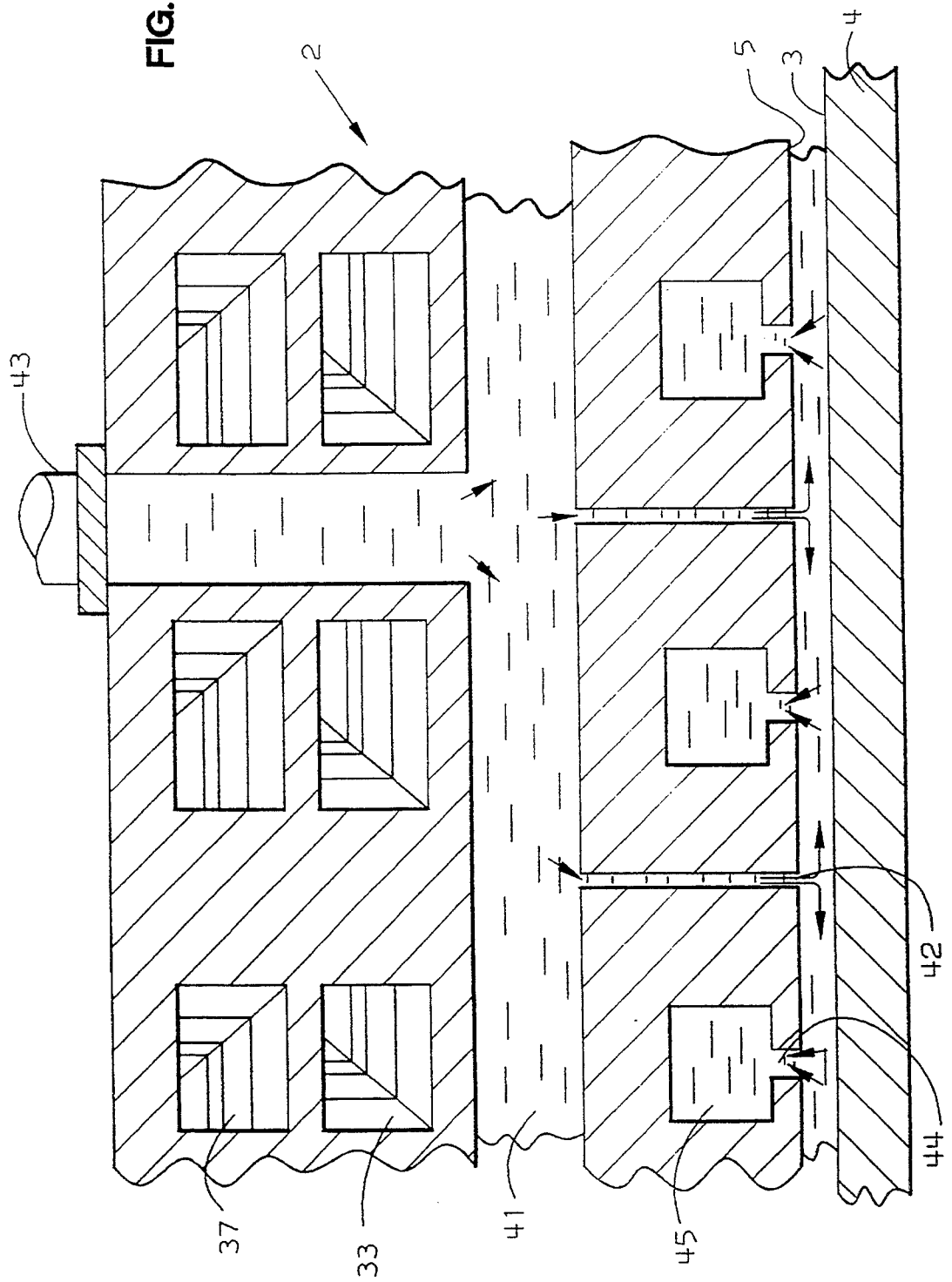

APPARATUS AND METHOD FOR FLUID PROCESSING OF ELECTRONIC PACKAGING WITH FLOW PATTERN CHANGE

FIELD OF THE INVENTION

The invention relates to devices for treating electronic components such as printed circuit boards and, in particular, a device for varying the flow of fluid about the item being treated. The invention also relates to a method of treating electronic components with a fluid.

BACKGROUND OF THE INVENTION

The use of fluid to perform various functions in the manufacturing and processing of electronic components such as printed circuit boards is well known. For instance, fluids are used to etch away certain portions of multi-layer circuit boards for example. The fluid treatment of electronic devices often involves immersing the devices in the treating fluid. However, the fluid in such treating baths is usually stagnant and, therefore, the fluid adjacent the device being treated often becomes saturated with the material being removed from the device. Saturation of the fluid decreases the amount of material which is removed from the device by an amount of fluid, decreasing the efficiency of the process and increasing the amount of fluid required to treat a substrate with a given area.

In order to avoid the problems associated with stagnant, saturated fluid next to the substrate being treated, devices were developed to direct fluid flow onto the surface of the electronic substrates being treated. Although these devices provide for improved process speed and uniformity compared to the previously known devices, and at least partially minimized chemical usage in environmental impact, such devices still produce regions in which the processing liquid is relatively stagnant.

In areas of stagnant fluid, such as the interiors of holes in substrates, whatever fluid reaches such areas tends to be retained on or in these areas (a phenomenon called puddling). Relatively little fresh fluid reaches these areas. Moreover, sprays often re-deposit or re-position, rather than remove, debris on the substrate, which then requires the use of additional sprays. Consequently, the use of sprays often requires the use of an undesirably large amount of processing area, which is also uneconomic. While attempts have been made to orient sprays to achieve directionality and thereby overcome some of the above-mentioned disadvantages, these attempts have typically been accompanied by a torque being imposed upon the substrate by the directed spray. This results in instabilities in the motion of the substrate, often causing jamming of the substrate in the corresponding processing equipment, resulting in damage to the substrate or equipment, which is undesirable and counterproductive.

As stated above, the reaction in areas of stagnant fluid may be reduced since fresh chemical is not replenished as rapidly. Also, particles contaminants can build-up in these regions which cause defects in the devices being processed. All of these problems with the prior art can result in a reduction in the uniformity of the process.

SUMMARY OF THE INVENTION

The present invention solves problems present in the prior art by providing fluid treatment devices using special fluid bearing and/or impinging jet geometries and methods of treating such substrates with such devices. According to preferred aspects of the present invention, processing fluids are applied by the present invention repeatedly in time sequence through a variety of fluid configurations. The rapidly changing liquid flow patterns sweep away stagnant treatment fluid and improve process speed and uniformity. The present invention may also minimize rinse water usage and environmental impact compared to known processing structures for electronic packaging. By repeatedly changing the flow pattern of the stagnant regions of treatment fluid located at different places in each flow pattern are prevented thereby preventing part of a build-up. Any stagnant regions in the fluid flow pattern are swept away by the changing flow pattern. Further, by changing the fluid flow pattern treatment fluid is provided to an action site and replenished. The change in the fluid flow pattern also breaks up chemical boundary layers near the device surface.

According to preferred aspects, the present invention provides a fluid treatment apparatus comprising at least one fluid flow manifold. The fluid flow manifold comprises at least one fluid head positioned on a first side of a substrate to be treated by the treatment fluid. The fluid flow manifold includes at least two sets of fluid jet injectors. The fluid flow manifold also includes means for receiving a treatment fluid and directing the treatment fluid into the fluid jet injectors. Each of the fluid jet injectors creates a fluid jet of the treatment fluid impinging upon the substrate. Means connected with the first flow manifold supplies treatment fluid to the manifold. Means connected between the supply means and the first fluid flow manifold alternates the flow of treatment fluid between these sets of fluid jet injectors. The fluid source is connected to the fluid supply means for supplying fluid to the fluid flow manifold.

According to other preferred aspects, the present invention also provides a fluid treatment apparatus, comprising a first fluid supply assembly including a plurality of fluid supply channels formed therein. The fluid supply assembly is located adjacent a first surface of a substrate to be treated. An injector mask interposed between the first fluid supply assembly and the substrate has a plurality of apertures which selectively obstruct some of the fluid supply channels. Alternatively, when a fluid supply is aligned with an aperture, the aperture allows fluid to pass from the fluid supply channels to the substrate. As the fluid flows through the apertures in the mask, it is formed into fluid jets.

According to this aspect of the invention, means is included for supplying a treatment fluid to the fluid supply assembly and to the fluid supply channels. A fluid source is, in turn, connected to the fluid supplying means.

To vary the flow of the treatment fluid means is provided for moving the fluid supply assembly and the injector mask relative to each other whereby the fluid supply channels aligned with the apertures in the injector mask and the fluid supply channels obstructed by the injector mask may be altered.

The present invention also includes a method for treating a substrate. The method varies, depending upon the embodiment of the fluid treatment apparatus used. One method of treating a substrate with a fluid includes the step of providing a fluid treatment apparatus adjacent a surface of the substrate to be treated. The fluid treatment apparatus comprises at least one fluid flow manifold including at least one fluid head. The fluid flow manifold includes at least two sets of a plurality of fluid jet injectors formed therein. Means is included in the apparatus for receiving a fluid and directing the fluid into the fluid jet injectors. Means interconnected with the first fluid flow manifold supplies the fluid to the fluid injector jets. Means connected between the supply means and the fluid flow manifold alternates a flow of the fluid through the sets of fluid jet injectors. Also, a fluid source is connected to the fluid supplying means. The method also includes the step of introducing a fluid into the fluid supply means. Further, the method includes the step of causing the fluid to flow alternately through one or more of the sets of the fluid jet injectors. Fluid is caused to flow through the sets of fluid jet injectors through which fluid did not previously flow. The method additionally includes the step of draining fluid away from the fluid flow manifold and the said substrate.

If the method of the present invention is practiced with an apparatus of the present invention including a substrate, injector mask, and fluid supply assembly which move relative to each other, the invention includes the step of locating a fluid supply assembly adjacent a surface of a substrate to be treated. The fluid supply assembly comprises a plurality of fluid supply channels formed therein. An injector mask is located between the fluid supply assembly and the surface of the substrate. The injector mask comprises a plurality of apertures formed therethrough. The apertures form the fluid flowing through them into fluid jets. The mask selectively obstructs some of the fluid supply channels and allows fluid to flow from the other fluid supply channels to the surface of the substrate by aligning a portion of the apertures in the injector mask with the fluid supply channels of the fluid flow manifold. Fluid is supplied to the fluid supply assembly and to the fluid supply channels. The position of the fluid supply assembly and the injector mask are altered relative to each other whereby the fluid supply channels aligned with the apertures in the injector mask and the fluid supply channels obstructed by the injector mask are altered.

BRIEF DESCRIPTION OF THE DRAWINGS

FIG. 8 represents a cross-sectional view of a portion of the apparatus shown in FIG. 7, showing an embodiment of an injector mask according to the present invention;

FIG. 10 represents a cross-sectional view taken along the line I in the embodiment shown in FIG. 3;

BEST AND VARIOUS MODES FOR CARRYING OUT THE INVENTION

Figure 1:
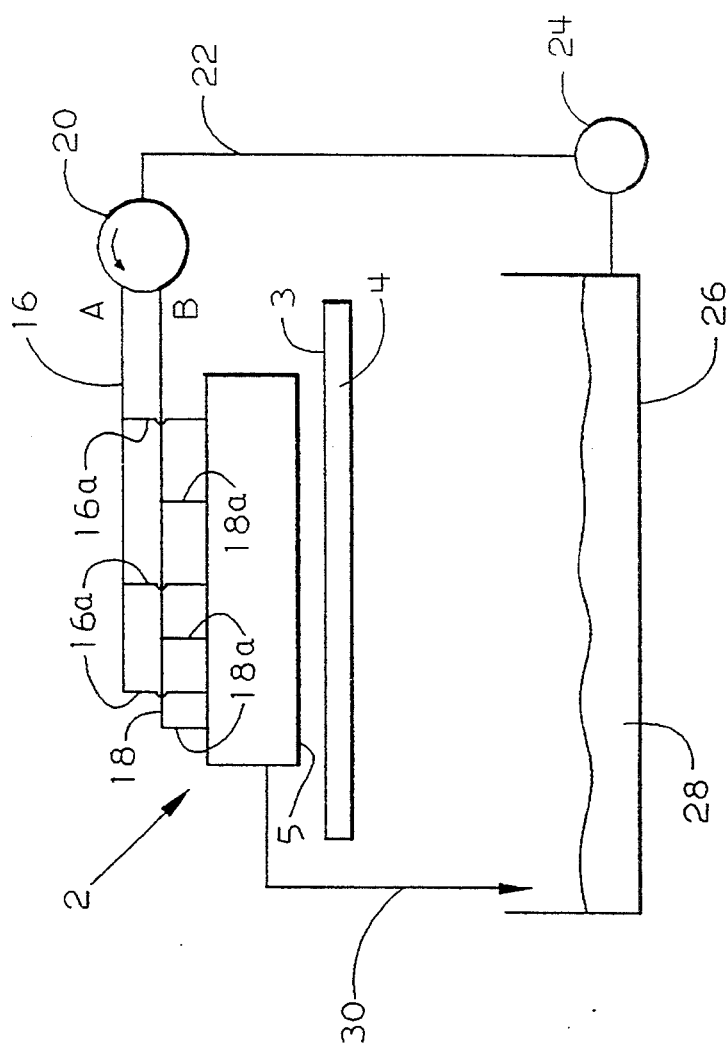
FIG. 1 represents a schematic view of one embodiment of a fluid flow treatment apparatus according to the present invention.

According to the present invention, a fluid treatment apparatus for producing multiple and varying flow patterns for directing a treatment fluid against a substrate. FIG. 1 shows the overall structure of one embodiment of a fluid treatment apparatus according to the present invention. The embodiment of the fluid treatment apparatus according to the present invention shown in FIG. 1 includes a fluid flow manifold 2 for directing treatment fluid toward a surface 3 of a substrate 4.

Figure 2:
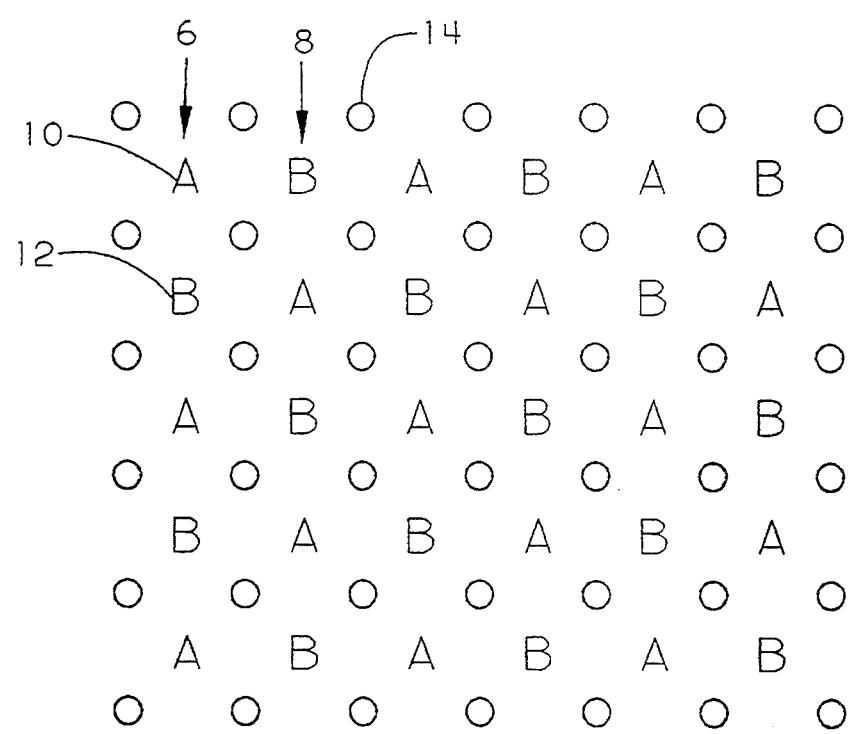
FIG. 2 represents a schematic view of a fluid injector pattern in a fluid flow manifold according to one embodiment of the present invention.

The fluid flow manifold 2 includes at least two sets of fluid jet injectors 6 and 8, shown in FIG. 2. Each set of fluid jet injectors 6 and 8 preferably includes a plurality of injectors 10 and 12, respectively. Each set of fluid jet injectors preferably creates at least one flow path for directing the treatment fluid toward the surface of the substrate.

As shown in FIG. 1, the inventive apparatus also includes the substrate, preferably a printed circuit board, at a distance, H, from the surface 5 of the fluid flow manifold.

Preferably, each of the fluid jet injectors is of equal diameter, D, which ranges from about 5 mils (0.005 inches) to about 250 mils (0.25 inches). Fluid jet injectors having diameters smaller than about 5 mils are undesirable because they are difficult to fabricate. On the other hand, fluid jet injectors having diameters greater than about 250 mils are undesirable because they require an undesirably large amount of pump flow to produce fluid jets.

The drilled holes which constitute the fluid jet injectors are preferably all of equal length, L. In this regard, the ratio L/D preferably ranges from about 0.5 to about 40. Ratios less than about 0.5 are undesirable because they result in poorly developed fluid jets. Ratios greater than about 40 are undesirable because the corresponding fluid jet injectors are difficult to fabricate and require an undesirably large amount of pump energy to achieve a useful flow rate.

The fluid jet injectors are preferably equidistantly spaced, with the center-to-center spacing between adjacent fluid jet injectors being denoted by S. The ratio S/D is necessarily greater than one (a ratio S/D=1 implies the fluid jet injectors are touching) but is preferably equal to or less than about 20. Ratios greater than about 20 are undesirable because after the corresponding fluid jets impinge upon the substrate 4, it has been found that the resulting fluid flows separate from the surface of the substrate 4 and form a region of recirculating fluid, which permits undesirable re-deposition of debris or spent fluid.

With reference to FIG. 1, as noted above, the fluid jets injected by the fluid jet injectors are to be submerged fluid jets, i.e., the fluid jets are to be injected into a layer of spent fluid covering the surface 3 and substantially filling the space between the surface 5 and the substrate 4. Such submerged fluid jets are achieved, in accordance with the invention, by bringing the substrate 4 into proximity with the surface 5 so that the ratio H/D ranges from about 0.2 to about 15. Ratios smaller than about 0.2 are undesirable because the substrate 4 is then so close to the surface 5 that the substrate is likely to become jammed against the surface 5. On the other hand, ratios greater than about 15 are undesirable because the substrate 4 is then so far from the fluid jet injectors that the corresponding fluid jets lose an undesirably large amount of momentum before impinging upon the substrate 4.

If the kinematic viscosity of the supplied fluid is denoted by nu and the speed of the fluid jets at the fluid jet injectors is denoted by V, then the Reynolds number associated with each of the fluid jets, defined as the ratio V*D/nu, preferably ranges from about 50 to about 30,000. Reynolds numbers less than about 50 are undesirable because the corresponding fluid jets have undesirably small momenta. On the other hand, Reynolds numbers greater than about 30,000 are undesirable because the achievement of such high Reynolds numbers requires undesirably high plenum pressures.

In the embodiment shown in FIG. 1, the fluid flow manifold 2 is connected to fluid supply means for supplying fluid to the manifold and hence to the injectors. Means is also provided to alternate the flow of fluid between the sets of injectors. Additionally, the fluid supply means is connected to a fluid source.

Preferably, the fluid jet injectors 10 and 12 are arranged in an alternating pattern whereby adjacent fluid jet injectors are not from the same set of fluid jet injectors. One possible arrangement for the sets of fluid jet injectors is shown in FIG. 2. The embodiment shown in FIG. 2 includes two sets of fluid jet injectors 6 and 8. The injectors 10 of one set 6 are labeled A; the injectors 12 of the second set 8 are labeled B. As can be seen in FIG. 2, in each horizontal row and vertical column, the fluid jet injectors are alternately arranged. Therefore, in each row and each column, no fluid jet injector from one array is adjacent another fluid jet injector from that array. Consequently, moving down each row or column, the injectors alternate from one array to the other. Although the fluid jet injectors 10 and 12 in the embodiment shown in FIG. 2 are arranged in alternating rows and columns, the fluid jet injectors 10 and 12 may be arranged in any manner which creates a varying fluid flow over the surface of the substrate when they are alternately activated.

The fluid flow manifold of the invention may also include means for draining fluid from the substrate surface. In the embodiment shown in FIG. 2, the draining means comprises a plurality of drain passages 14 formed in the fluid flow manifold. Fluid may also drain laterally off the surface of the substrate.

The fluid drains through the passages due mostly to a fluid pressure differential between the drain passages and the fluid jet injectors. A negative pressure may be applied to the drain passages to facilitate the draining of the fluid. However, a pressure differential will exist without the application of a negative pressure simply because the fluid is ejected from the injectors at a pressure and if no pressure is applied to the drain passages.

In either case, the fluid will exit the injectors and impact the surface of the substrate. As more fluid flows out of the injectors, fluid and, consequently, fluid pressure will build up between the substrate and the fluid head. The fluid will then naturally flow into the drain passages to relieve the pressure.

In the embodiment of the fluid flow manifold shown in FIG. 2 the drain passages 14 are arranged in rows and columns. Preferably, the injectors are arranged such that they are intermediate between injectors and are not within the same row or column as the injectors. Although in the embodiment shown in FIG. 2 the drain passages 14 are arranged in a regular pattern of rows and columns and are interdigitated with the fluid jet injectors, the drain passages may be arranged in any pattern which allows them to prevent buildup of the treatment fluid. For instance the drain passages 14 may be aligned with the fluid jet injectors 10 and 12 or provided in the same rows as the fluid jet injectors. The drain holes preferably prevent a build-up of fluid within the fluid flow manifold.

In the embodiment shown in FIG. 1, fluid is supplied to the fluid flow injectors 10 and 12 by fluid flow conduits 16 and 18. Preferably, there is at least one fluid flow supply conduit for each set of fluid flow injectors. In the embodiment shown in FIG. 1, the fluid flow supply conduit 16 is connected to the array 6 of fluid jet injectors and the fluid flow supply conduit 18 is connected to the array 18 of fluid jet injectors. The fluid flow supply conduit 16 preferably includes a plurality of branch fluid flow supply conduits 16a which are connected directly to the individual fluid jet injectors 10 of the set of injectors 6. Preferably, the fluid flow supply conduit 16 includes a plurality of branch fluid flow supply conduits 16a. Each branch supplies one or more fluid jet injectors.

The other set of fluid jet injectors 8 in the embodiment shown in FIG. 1 preferably is supplied with treatment fluid via a fluid flow supply conduit 18. The fluid flow supply conduit 18 supplies treatment fluid to the set of fluid flow injectors 8 with a plurality of branch fluid flow supply conduits 18a.

Preferably, the flow of fluid through the sets of fluid jet injectors may be varied such that treatment fluid flows through one or more sets of injectors at full flow and through the other set(s) of injectors at a reduced flow. Alternatively, no fluid may flow through the other fluid jet injectors while fluid rows through the first injectors. The flow rates are then alternated between the sets of injectors to create a variable flow over the substrate surface.

Fluid flow may be varied between the two sets of fluid jet injectors 6 and 8 by providing a fluid flow supply conduit 16 and 18 each with a separate fluid source and means to pump fluid through the fluid flow supply conduits and means to alternate the flow between the sets of fluid jet injectors. Alternatively, as shown in FIG. 1, the present invention preferably includes means connected to both fluid flow supply conduits for alternating the flow of fluid through the fluid flow supply conduits 16 and 18 and, hence, the sets of fluid jet injectors 6 and 8. In the embodiment shown in FIG. 1, the fluid flow alternating means incudes a rotating valve 20 connected at one end to a main fluid flow supply conduit 22 and including two outlets. One outlet is connected to the fluid flow supply conduit 16 and the other outlet is connected to the fluid flow supply conduit 18.

The valve 20 preferably includes a plurality of flow passages such that as it rotates, it alternately provides an interconnection between the fluid flow supply conduit 16 and the main fluid flow supply conduit 22 and the fluid slow supply conduit 18 and main fluid flow supply 22. Preferably, while fluid is flowing from the main fluid flow supply conduit 22 to the fluid flow supply conduit 16, no fluid flows from the main fluid flow supply conduit 22 into fluid flow supply conduit 18. Similarly, while fluid is flowing from the fluid flow supply conduit 22 to the fluid flow supply conduit 18, preferably no fluid is flowing into the fluid flow supply conduit 16. As in the embodiments shown in FIG. 1, the valve 20 rotates counterclockwise. However, the direction of rotation of the valve and the resulting alternation of flow into the fluid flow supply conduits may be variable.

Preferably, the end of the main fluid flow supply conduit 22 not connected to the valve 20 is connected to a pump 24. The pump 24 preferably supplies fluid from a fluid source to the main fluid flow supply conduit 22 and, in turn, to the valve 20, the fluid flow supply conduits 16, 18, the branch fluid flow supply conduits 16a and 18a, the fluid jet injectors 10 and 12 of the fluid flow manifold 2 and to the surface 3 of the substrate 4.

In the embodiment shown in FIG. 1, the fluid source connected to the pump 20 is a sump or reservoir 26. The sump or reservoir 26 may be provided with an initial supply of fluid 28 to be pumped through the system and then applied to the surface 3 substrate 4. Fluid may also flow to the sump 26 from the drain passages 14 formed in the fluid flow manifold 2. Further, fluid which has previously been applied to the surface 3 of the substrate 4 may flow off of the surface of the substrate and into the sump 26.

Fluid flowing off of the surface 3 substrate 4 into the sump 26 will contain material removed from the surface of the substrate. However, this material may be diluted when mixing with the other fluid in the sump. Alternatively, the present invention may include means to drain the fluid which has been used to treat the substrate away from the system and means to supply further fluid to the sump 26 to replace that fluid which has been previously used to treat the substrate. Such means may be comprised of a barrier interposed between the substrate and the sump which collects fluid as it flows off the substrate and prevents it flowing back into the sump.

Although the embodiment of the present invention shown in FIGS. 1 and 2 incudes two sets of fluid jet injector arrays 6 and 8, the fluid treatment apparatus may include more than two fluid jet injector arrays. For instance, the embodiment shown in FIG. 3 incudes three arrays of fluid jet injectors 32, 36, and 40. The fluid jet injectors in such an embodiment may be arranged in any manner so as to provide an alternating fluid flow to the surface of the substrate being treated.

Figure 3:
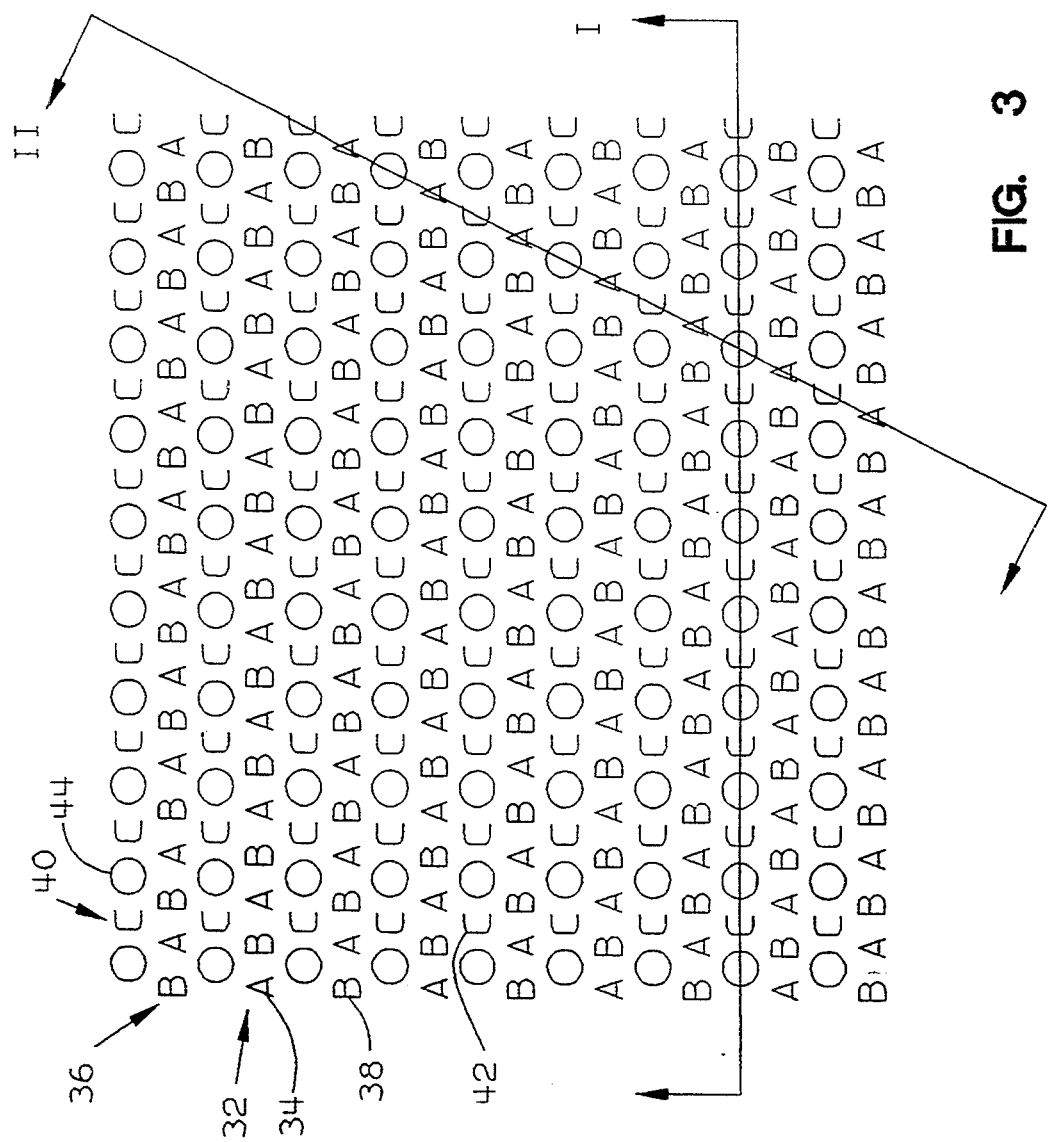
FIG. 3 represents a schematic view of another embodiment of a fluid treatment apparatus according to the present invention.

In the embodiment shown in FIG. 3, individual fluid jet injectors 34 from the array 32 and 34 from the array 36 marked A and B respectively are arranged alternately within rows. Alternately arranged with the rows of A and B fluid jet injectors are rows of fluid jet injectors 42 from array 40. The fluid jet injectors 42 are alternately arranged within the rows with drain passages 44. An embodiment of the present invention, such as that shown in FIG. 3, having three sets of fluid flow injectors may provide more fluid flow and more variation in fluid flow than two sets of injectors in some situations, although the apparatus functions well with two sets.

An array including three sets of injectors requires either three separate fluid flow supply conduits as three separate pumps and means to alternate the activation of each pump or, alternatively, the fluid supply fluid flow supply conduit may be similar to the embodiment shown in FIG. 1 wherein a rotating valve is located in the fluid flow supply conduit. However, three fluid flow injector sets necessitates including a third fluid flow supply conduit with a plurality of branch fluid flow supply conduits connected to the injectors of the third injector set. A three way valve would preferably include a third fluid flow supply conduit emanating from the valve and additional flow passages within the valve providing flow between the main fluid flow supply conduit connected to the pump and the third set of injectors. Such an embodiment preferably would provide fluid flow to each set of injectors individually while restricting flow to the other two.

FIG. 10 shows a cross-sectional view of the fluid flow manifold having three sets of fluid jet injectors shown in FIG. 3 at a moment when fluid is flowing through the injectors 42 of the set of injectors 40. The view shown in FIG. 10 represents a cross-section taken along the line I in the embodiment shown in FIG. 3. The fluid jet injectors 34 of the set of fluid jet injectors 32 are fed with fluid by the supply ducts 33. As can be seen in FIG. 10, the supply ducts 33 are angled to the right and may be seen in longitudinal cross-section in FIG. 11. As with the fluid supply ducts supplying the other sets of fluid jet injectors, the supply ducts 33 extend through the fluid flow manifold. Preferably, at regularly spaced intervals, a fluid jet injector branches off of the supply duct. This branching may be seen in more detail lower in FIG. 10 and as described below regarding the set of fluid jet injectors 40.

As also shown in FIG. 10, fluid is supplied to the fluid jet injectors 38 of the set of fluid jet injectors 36 by the supply ducts 37. As can be seen in FIG. 10, the supply ducts 37 angle to the left and may be seen from an alternative direction in the embodiment shown in FIG. 11.

The supply duct 41 for the injectors 42 of the set of fluid jet injectors 40. As can be seen in FIG. 10, the fluid supply duct 41 feeds fluid to the fluid jet injectors 42. Fluid is supplied to the fluid supply ducts 41 through the fluid supply connection 43 which may be connected to the three way valve, the fluid pump, and ultimately to the sump or reservoir.

The drain passages 44 may also be seen in cross-section in FIG. 10. The drain passages are connected to drain ducts 45 which may be connected to a drain conduit 30. The drain channels extend orthogonal to the cross-section shown in FIG. 10.

As seen in FIG. 10, the fluid flows into the supply duct 41, is then fed into fluid jet injectors 42, impacts upon the surface of the substrate 3, and then passes into drain passages 44 to be drained through the drain ducts 45. The sets of fluid jet injectors 32 and 36 are configured and function in a similar manner. All of the fluid flowing onto the substrate through all of the fluid jet injectors may flow through the same drain channels.

Figure 11:
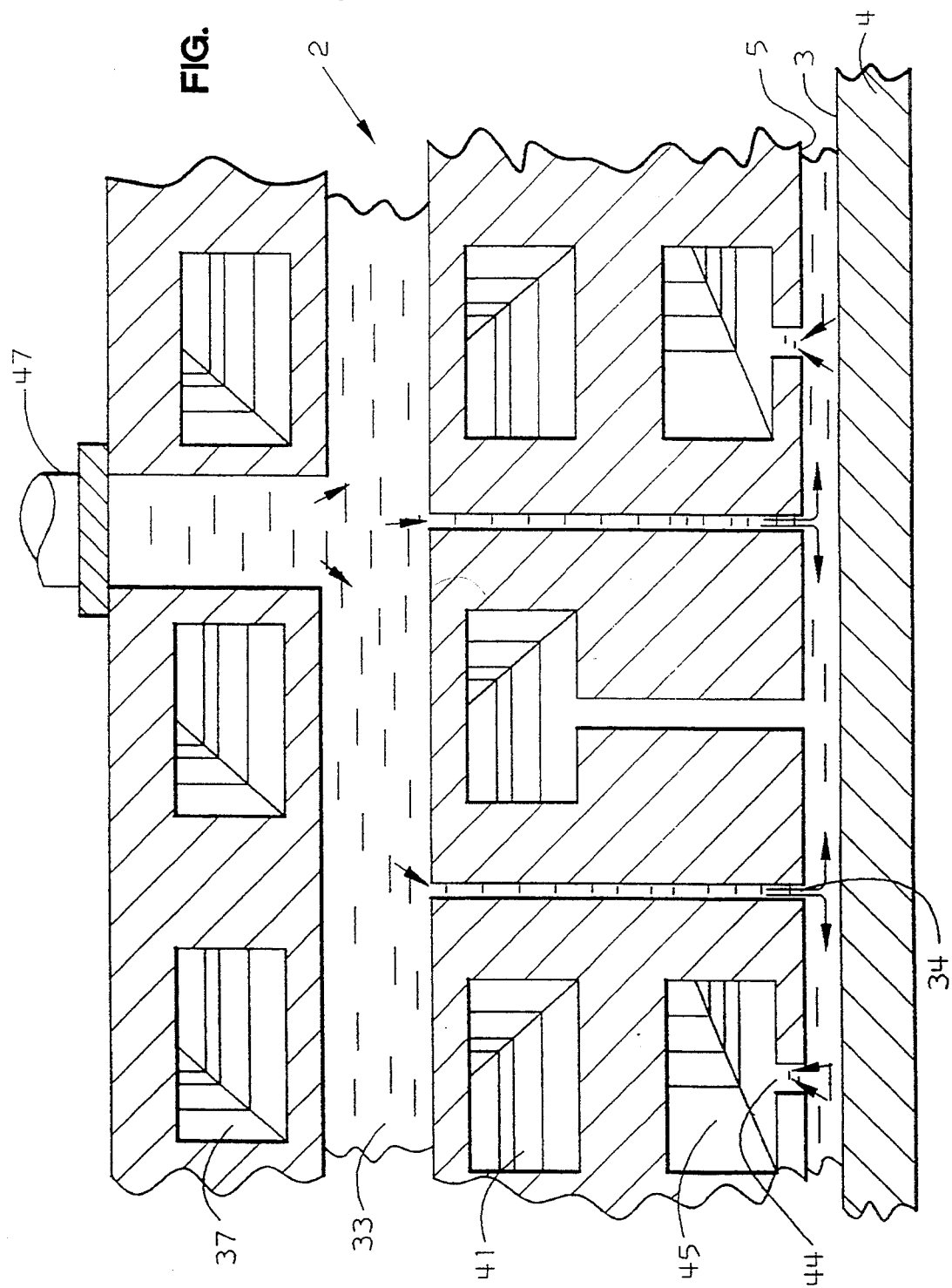
FIG. 11 represents a cross-sectional view taken along the line II in the embodiment shown in FIG. 3.

FIG. 11 shows a cross-section of the fluid flow manifold having three sets of fluid jet injectors along the line II in the embodiment shown in FIG. 3 at a moment in time when fluid is flowing through fluid jet injectors 34 of the injector set 32. The supply ducts of the set of fluid jet injectors 32 is shown in longitudinal cross-section in FIG. 11.

The fluid treatment apparatus of the present invention may also include a second fluid flow manifold 46. The second fluid flow manifold may also include at least two fluid jet injectors formed therein. The fluid jet injector may be arranged as described above with regard to the first fluid flow manifold. In an embodiment including two fluid flow manifolds, the second fluid flow manifold preferably also includes a drain conduit 48 common to the drain conduit 30 from the first fluid flow manifold. A large substrate may include a large fluid flow manifold adjacent one or both sides of the substrate. Alternatively, a large substrate may include a plurality of fluid flow manifolds located adjacent separate areas of the surface of the substrate.

Regardless of the embodiment, the diameter of the drain holes preferably is at least about two times the diameter of the fluid injectors. The size of the injectors should preferably be such that back pressure which may tend to hinder the flow of fluid out of the injectors is prevented or at least minimized. Further, the drain passages preferably are spaced about at least one drain passage diameter apart so as to allow an efficient fluid flow from the fluid injectors and to the drain passages.

Additionally, the distance between the drain passages and the fluid injectors is greater than radii of either. Preferably, the fluid injectors and the drain passages are separated by at most a distance equal to twenty time the diameter of the injectors. If the drain and the injectors were any farther apart, the fluid jet emanating from the fluid jet injector would not be strong enough to be effective.

Typically, the various fluid flow manifolds may be formed from, for example, plastics such as LEXAN, PVC, CPVC, or KYNAR, among others. The manifold may be constructed by joining multiple layers of material appropriately formed or machined with the depicted passages and cavities. Regardless of which embodiment is used, the fluid flow manifold(s) may be located away from the edge of the substrate a distance equal to about 3–4 diameters of the fluid jet injectors. Typical substrates treated according to the present invention vary from about 0.5" by about 0.5" up to about 30" by about 30", although larger or smaller substrates may be treated. The fluid flow manifold may be made up to about 42" to about 44". However, larger fluid flow manifolds may be made according to the present invention.

In the above-described embodiments, typical pulse rates are from 1–4 hertz. In operation, the fluid flow alternates between injectors.

Figure 5:
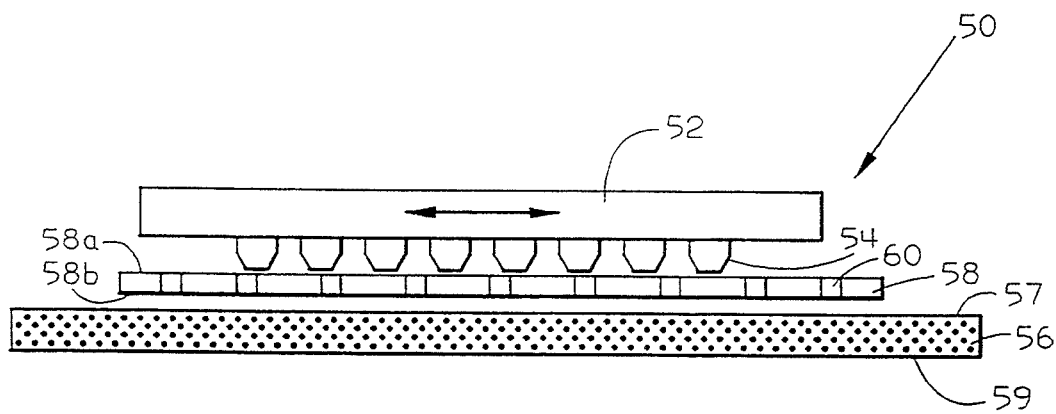
FIG. 5 represents a cross-sectional view of a third embodiment of a fluid treatment apparatus according to the present invention.
Figure 7:
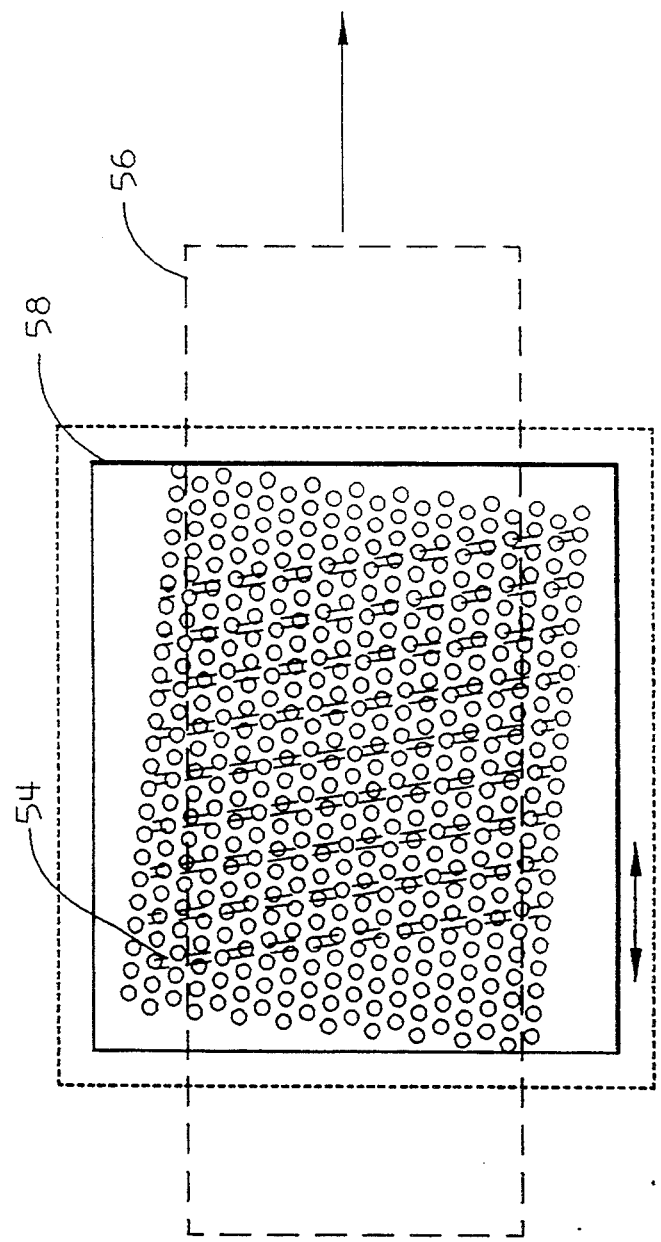
FIG. 7 represents an overhead view of the embodiment shown in FIG. 5.

In the embodiments of the present invention described above fluid flow is alternated between sets of fluid jet injectors and fluid manifolds to produce a varying flow pattern impacting upon the surface of a substrate being treated. In alternative embodiments of the present invention, an activated set of fluid supply channels and an injector mask are moved relative to each other to change the fluid flow pattern. One embodiment of such a fluid treatment apparatus is shown in FIG. 5. The embodiment shown in FIG. 5 includes fluid supply assembly 50 having a fluid head including a plurality of fluid supply channels 54. The fluid supply channels may also be seen in FIG. 7 as outlined by small dots. The fluid supply assembly is located adjacent a surface 57 of a substrate 56 to be treated.

Preferably located between the fluid supply assembly 50 and the substrate 56 is an injector mask 58. The fluid injector mask 58 is shown in cross section in FIG. 8. The injector mask includes a plurality of passages formed therein to allow fluid to flow from the supply channels 54 of the fluid head of the fluid supply assembly 50.

The injector mask 58 includes a plurality of apertures 60 allowing fluid to flow from the fluid supply channels 54 to the surface 57 of substrate 56. As the fluid flows through the apertures 60, it is formed into fluid jets. The passages 60 in the injector mask 58 are situated to selectively allow fluid to flow from certain portions of the fluid supply channels. By moving the fluid supply assembly relative to the injector mask, and/or the substrate 56, the flow of fluid through the injector mask as well as the flow of fluid over the surface of the substrate 56 may be altered. By varying the movement of the fluid head, injector mask, and/or substrate 56, the fluid flow may be altered in a desired manner. The changing fluid flow causes the flow distribution on the device to rapidly change direction. This changing flow pattern changes the fluid flow such that stagnant areas are replaced with fresh fluid and trapped contaminants in these areas are washed away. As a result, fresh active fluid is replenished in the fluid layer adjacent the surface of the substrate. Openings in the injector mask which are not directly in the path of a fluid supply channel at any one time can serve as drain channels carrying spent solution to drain channels between the injector slots.

As shown in FIG. 5, the substrate 56, preferably a printed circuit board, may be located at a distance, H, from the surface 58b of the injector mask.

Preferably, each of the apertures in the injector mask is of equal diameter, D, which ranges from about 5 mils (0.005 inches) to about 250 mils (0.25 inches). Apertures having diameters smaller than about 5 mils are undesirable because they are difficult to fabricate. On the other hand, apertures having diameters greater than about 250 mils are undesirable because they require an undesirably large pump flow rate to produce fluid jets.

The drilled holes which constitute the apertures, which actually function as fluid jet injectors, are preferably all of equal length, L. In this regard, the ratio L/D preferably ranges from about 0.5 to about 40. Ratios less than about 0.5 are undesirable because they result in poorly developed fluid jets. Ratios greater than about 40 are undesirable because the corresponding apertures are difficult to fabricate and require an undesirably large amount of pump energy to achieve a useful flow rate.

The apertures are preferably equidistantly spaced, with the center-to-center spacing between adjacent apertures being denoted by S. The ratio S/D is necessarily greater than one (a ratio S/D=1 implies the apertures are touching) but is preferably equal to or less than about 20. Ratios greater than about 20 are undesirable because after the corresponding fluid jets impinge upon the substrate 56, it has been found that the resulting fluid flows separate from the surface of the substrate 57 and form a region of recirculating fluid, which permits undesirable re-deposition of debris or spent fluid.

With reference to FIG. 5, as noted above, the fluid jets created by the apertures may be submerged fluid jets, i.e., the fluid jets are to be injected into a layer of spent fluid covering the surface 57 and substantially filling the space between the surface 58b and the surface 57 substrate 56. Such submerged fluid jets are achieved, in accordance with the invention, by bringing the substrate 56 into proximity with the surface 58b so that the ratio H/D ranges from about 0.2 to about 15. Ratios smaller than about 0.2 are undesirable because the substrate 56 is then so close to the surface 58b that the substrate is likely to become jammed against the surface 58b. On the other hand, ratios greater than about 15 are undesirable because the substrate 56 is then so far from the fluid jet injectors that the corresponding fluid jets lose an undesirably large amount of momentum before impinging upon the substrate 56.

If the kinematic viscosity of the supplied fluid is denoted by nu and the speed of the fluid jets at the fluid jet injectors is denoted by V, then the Reynolds number associated with each of the fluid jets, defined as the ratio V*D/nu, preferably ranges from about 50 to about 30,000. Reynolds numbers less than about 50 are undesirable because the corresponding fluid jets have undesirably small momenta. On the other hand, Reynolds numbers greater than about 30,000 are undesirable because the achievement of such high Reynolds numbers requires undesirably high plenum pressures.

Figure 9A:
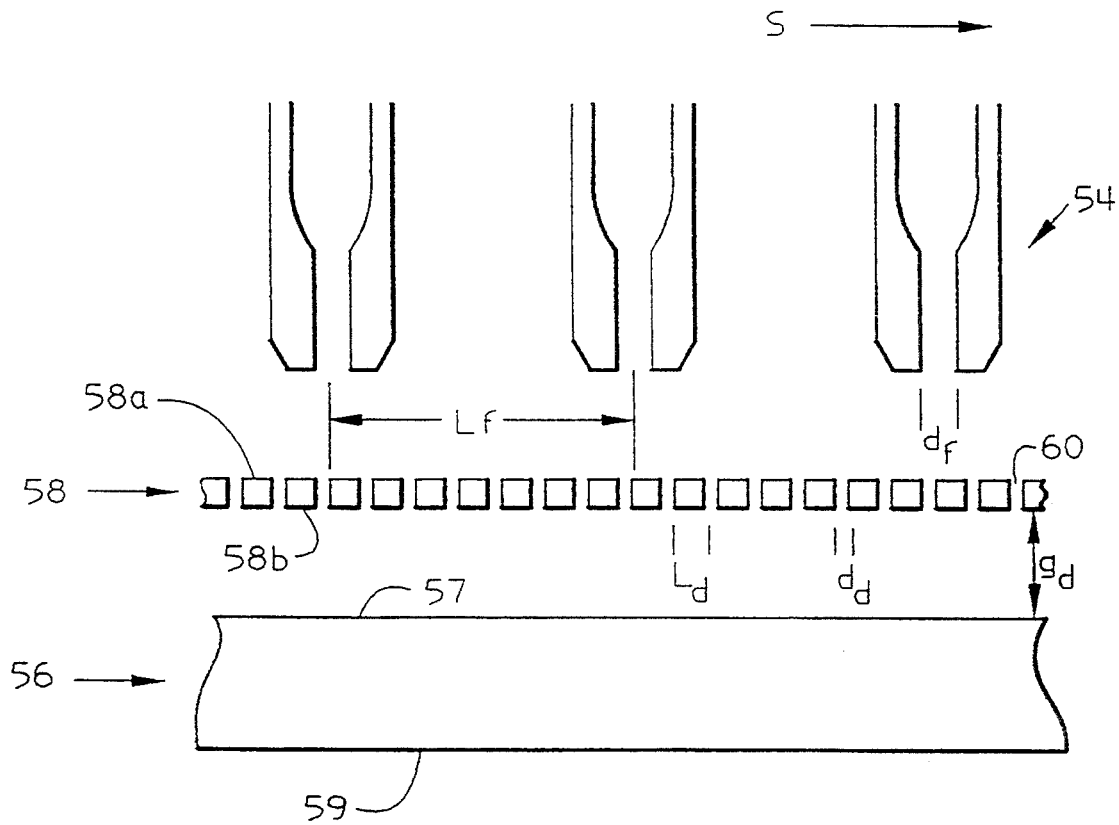
FIG. 9a represents a cross-sectional view of an embodiment including a fluid supply assembly and an injector mask showing the various physical dimensions of components of the embodiment.
Figure 9B:
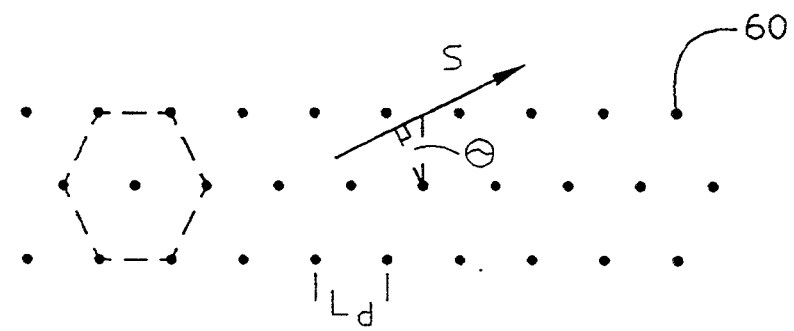
FIG. 9b represents a schematic overhead view of the placement of the apertures in the injector mask.

In one example of this embodiment of the invention shown in FIG. 9, a fluid supply assembly including fluid supply channels having a diameter of $d_f$ of about 0.020" and located a distance apart $L_f$ of about 0.060" is substantially adjacent the injector mask 58. In one embodiment, the distance $g_f$ between the surface of the fluid supply assembly and the injector mask is about 0.007". In this embodiment, the apertures in the injector mask have an inner diameter $d_d$ of about 0.020" and are arranged in a hexagonal pattern, such as at the corners of a hexagon, a distance apart $L_d$ of about 0.040". The distance $g_d$ between the surface of the injector mask and the surface of the substrate is about 0.040".

The above-described example operated with the injector mask moving a speed S of 12 inches per second and with a flow $F_i$ through a single injector of 5 cubic centimeters per second (0.305 cubic inches per second) produces the following operational parameters:

| Value | Formula for calculation | Example |
|---|---|---|
| Pulse duration | Max[($d_f$/s) ($d_d$/s)] | 1.7 ms |
| Pulse frequency (major) | s/$L_f$ | 200 hz |
| Pulse frequency (minor) | 2S/$L_d$, $\theta = 0$ | 600 hz |
| Drain-to-injector ratio | ($L_f/L_d$) − 1, $\theta = 0$ | 2 |
| Residence time of fluid traveling between injector and drain during pseudo steady pulse | ($F_i/d_d g_d L_d$)$^{-1}$ | 105 $\mu$s |

The fluid supply assembly preferably is connected to a fluid source. The fluid source may be somewhat similar to that shown in FIG. 1 wherein the fluid is contained in a sump or reservoir which also serves to contain fluid flowing off of the substrate as the substrate is treated. The fluid may be pumped out of the fluid reservoir or sump with a pump and pumped to a fluid supply fluid flow supply conduit and connected to the fluid supply assembly. The fluid supply manifold preferably includes means for distributing the fluid among the fluid supply channels.

Figure 6:
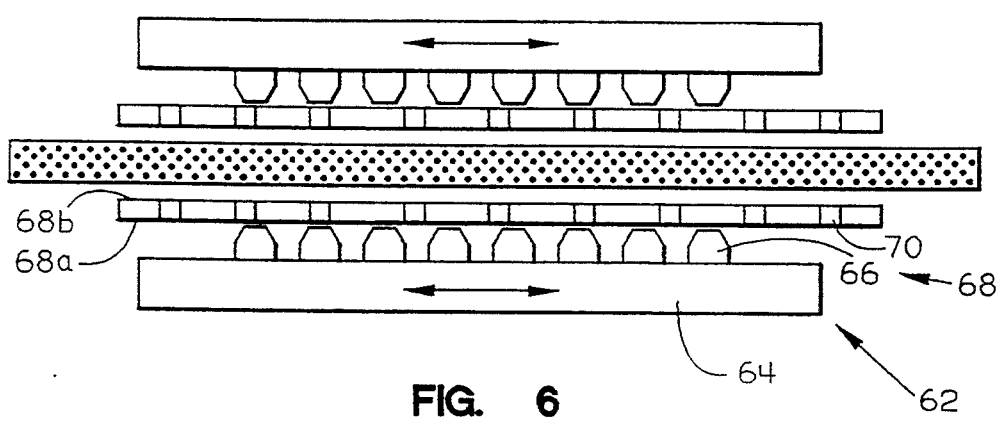
FIG. 6 represents a cross-sectional view of a fourth embodiment of a fluid treatment apparatus according to the present invention.

A second fluid supply assembly may be added to the embodiment by the present invention shown in FIG. 6. The second fluid supply assembly 62 preferably is similar to the fluid supply assembly 50 shown in FIG. 5 and described above. The embodiment shown in FIG. 6 preferably also incudes an injector mask 68 having a plurality of apertures 70 formed therethrough similar to the injection mask in the embodiment including one fluid supply assembly.

The apertures 60 and 70 formed in the injector masks 58 and 68 preferably are formed as shown in FIG. 8. These apertures 60 and 70 are formed from two oppositely arranged frustoconical sections 72 and 74 and a cylindrical section 76. The narrowest ends of the frustoconical sections 72 and 74 preferably are connected by the cylindrical section 76. The widest ends of the frustoconical sections 72 and 74 preferably intersect the outer surfaces 58a and 58b and 68a and 68b of the injector masks.

Such a design of the apertures in the fluid injection mask allows the frustoconical section facing the fluid supply channels in the fluid supply assembly to help collect the stream flowing from the fluid supply channel. When, for instance, one of the apertures in one of the upper fluid supply assembly 58 is not aligned with a fluid supply channel, the funnel helps to collect fluid and carry it away from the apparatus. In the lower fluid supply assembly shown in FIG. 7 the upper funnel may help to drain fluid away from the substrate 56.

Preferably, the fluid supply channels in the fluid supply assemblies and the apertures in the injector are arranged so that a certain number of fluid supply channels will be aligned with apertures at any given time producing a given amount of flow. The amount of flow should be sufficient to produce the desired amount of flow on the substrate surface 57 and 59.

Regardless of the embodiment, the diameter of the apertures in the injector mask preferably are all substantially the same. The size of the apertures should preferably be such that back pressure which may tend to hinder the flow of fluid out of the injectors is prevented or at least minimized. Further, the apertures preferably are spaced about at least one aperture diameter apart so as to allow an efficient fluid flow out of the apertures aligned with a fluid supply channel and into the apertures not aligned with a fluid supply channel.

Additionally, the distance between the apertures greater than their radii. Preferably, the apertures are separated by at most a distance equal to twenty time the diameter of the apertures. If the apertures were any farther apart, the fluid jet emanating from an aperture would not be strong enough to be effective.

Typically, the various fluid supply assemblies and injector may be formed from, for example, plastics such as LEXAN, PVC, CPVC, or KYNAR, among others. Regardless of which embodiment is used, the injector mask may be located a distance from the edge of the substrate equal to about 3–4 diameters of the apertures in the mask. Typical substrates treated according to the present invention vary from about 0.5" by about 0.5" up to about 30" by about 30", although larger or smaller substrates may be treated. The injector mask may be made up to about 42" to about 44". However, larger injector masks may be made according to the present invention.

In such embodiments, 600–800 hertz is typical of the pulse rates which are possible. In operation, the flow will actually reverse direction in individual apertures of the injector mask since when an aperture is aligned with a supply channel, the fluid will flow through the aperture to the substrate and when an aperture is not aligned with a supply channel, the aperture will act as a drain as described above. Greater pulse rates are possible with the embodiment including the injector mask as compared to the fluid flow manifold because the plumbing needed for the fluid flow manifold can dampen the fluid flow pulsations.

The present invention also includes a method of treating a substrate with a fluid treatment apparatus. Using an embodiment of the fluid treatment apparatus of the present invention as shown in FIG. 1, the method includes positioning a substrate under a fluid treatment apparatus as described above, providing a treating fluid to each set of fluid jet injectors in succession. If the fluid flow manifold includes two sets of fluid jet injectors, the flow preferably alternates between the sets of injectors such that when fluid is flowing through the jets of one set of injectors, no fluid is flowing through the other set of injectors or is flowing through the other set of injectors at a reduced rate as compared to the active set of injectors. In an embodiment including three sets of injectors as shown in FIG. 3, the flow preferably alternates in sequence between the set of injectors 32, 36 and 40 and then back to 32 repeating the cycle. Alternatively, two sets of injectors could be activated while one is deactivated. The method of the present invention may be practiced with fluid flow manifolds including more than three sets of injectors. The fluid jet injectors may be activated at any sequence which creates a variable flow pattern of the treatment fluid over the substrate.

The method of the present invention practiced with the embodiment of the fluid treatment apparatus shown in FIG. 1 also preferably includes pumping the treatment fluid from a fluid source such as the reservoir or sump 26 using the pump 24. The fluid is pumped to the rotating valve 20. The rotating valve, which has been previously activated, rotates, thereby establishing a connection between the main fluid flow supply conduit 22 and each of the fluid flow supply conduits 16 and 18. The treatment fluid then flows through the branch flow fluid flow supply conduits 16a and 18a into the fluid jet injector sets.

Fluid passing through the fluid jet injectors preferably passes through the drain holes in the fluid flow manifold and flows onto the substrate. The fluid reaching the surface 3 of the substrate 4 then acts upon the substrate with the desired effect of the treatment fluid. Preferably, the fluid flowing onto the substrate is displaced by new fluid flowing onto the substrate from the fluid jet injectors.

Some of the excess fluid may flow off of the substrate into the sump where it may then be recycled and pumped into the fluid treatment apparatus. However, most of the fluid preferably flows from about the surface of the substrate through drain passages in the fluid head due to a lower pressure within the drain passages than exists at the fluid jet injectors, as described above. A negative pressure may be applied to the drain passages to facilitate the flow of fluid away from the surface of the substrate. The fluid preferably is then drained away from the fluid head through the fluid drain conduit 30 and into the sump.

Fresh fluid may be added to the spent fluid in the sump. Alternatively, the spent fluid may be discarded.

Figure 4:
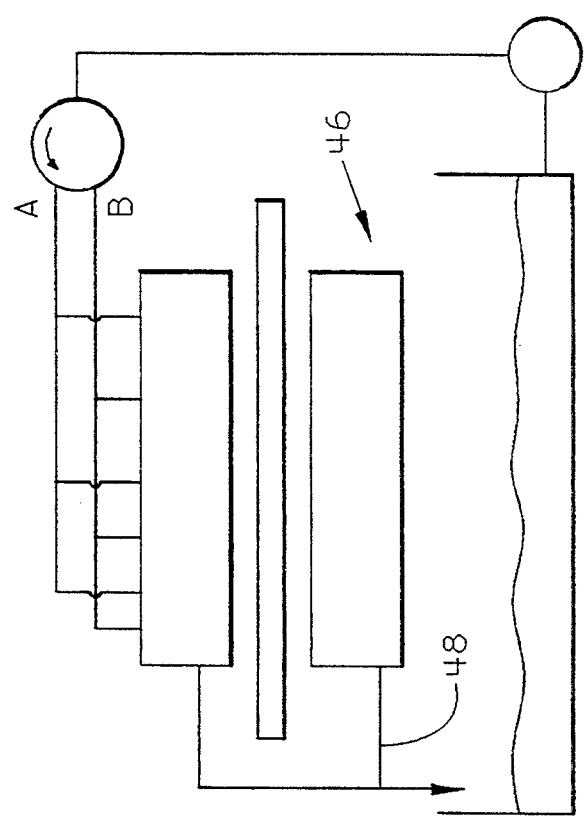
FIG. 4 represents a schematic view of a second embodiment of a fluid injector pattern for use with a fluid treatment apparatus according to the present invention.

In an embodiment of the fluid treatment apparatus shown in FIG. 4, which includes two fluid flow manifolds, fluid may be simultaneously provided to the fluid jet injector in each fluid flow manifold. Alternatively, fluid may be pumped to only one of the fluid flow manifolds to treat only one surface of the substrate or the fluid may be provided to the fluid flow manifolds in sequence. In an embodiment of the invention including more than one fluid flow manifold on a side of the substrate, the injector jets in each of the fluid flow manifolds may be reactivated at the same time or in a sequence in which injector sets in less than all the fluid flow manifolds are activated at any one time.

A method of treating a substrate with an embodiment of the invention shown in FIG. 5, fluid is provided to the moveable fluid supply assembly. The fluid flows from the fluid supply channels through the apertures in the injector mask and then impacts upon the panel. According to the method of the present invention, the fluid flow through the injector mask apertures may be varied by moving the fluid supply assembly and the injector mask relative to each other. Preferably, the injector mask is stationary and the fluid supply assembly moves. As the fluid supply assembly is moved, the fluid supply channels are alternately blocked by the surface of the injector mask in which apertures are not formed. When one of the supply is aligned with one of the apertures in the injector mask, fluid will flow from the supply channel through the aperture and onto the surface of the substrate being treated. Typically, the substrate being treated by any apparatus of method according to the present invention is a printed circuit board.

Preferably, the fluid supply assembly oscillates in a fluid flow supply conduit direction as shown by arrow in FIG. 5. However, the supply assembly may oscillate in other directions as well or alternatively. Preferably, the substrate being treated also moves underneath the injector mask as in the embodiment shown in FIG. 5. The direction of travel of the substrate is indicated by the single arrow to the far right of the embodiment shown in FIG. 7.

As the fluid passes through the injector mask onto the surface of the substrate being treated, the fluid then may flow over the surface of the substrate and as it is displaced by more fluid flowing from the same or other injector jets through the same or other apertures in the injector mask. Preferably, most of the fluid then passes into the apertures through which fluid is not being directed from the fluid source channels. The fluid will pass into the apertures since the apertures will have a lower fluid pressure than the apertures through which fluid is flowing. Some of the fluid may also be displaced over the side of the substrate as additional fluid continues to be directed toward the surface of the substrate by the fluid supply channels. The fluid may then be collected in a sump similar to that shown in FIGS. 1 and 4. The spent fluid may then be discarded, mixed with fresh fluid, or pumped straight back to the fluid flow manifold to be passed over the substrate again.

The method of the present invention may also include treating both sides of the substrate simultaneously with an apparatus one embodiment of which is shown in FIG. 6. In this embodiment, a moveable fluid supply assembly and an injector mask are located on both sides of the substrate being treated. According to this method, fluid may be directed through both of the moveable fluid supply assemblies and hence through the injector masks onto both sides of the panel simultaneously or sequentially.

In an embodiment in which more than one moveable fluid supply assembly and more than one injector mask is located on each side of the substrate, the fluid supply channels in the fluid supply assemblies may be activated simultaneously or, some number less than the entire number fluid supply channels may be activated at any one time. The fluid flows through the fluid supply channels through the apertures in the injector mask and onto the panel. The fluid then reacts with the desired material on the surface of the substrate and then is drained away from the surface of the substrate.

The fluid may be displaced or may drain through apertures in the injector mask through which fluid is not flowing at any one time. The fluid may also flow off of the surface of the substrate and may be collected. Then, the fluid may be recycled, partially recycled or discarded as described above regarding the method in which the embodiment shown in FIG. 6 is used.

Figure 12:
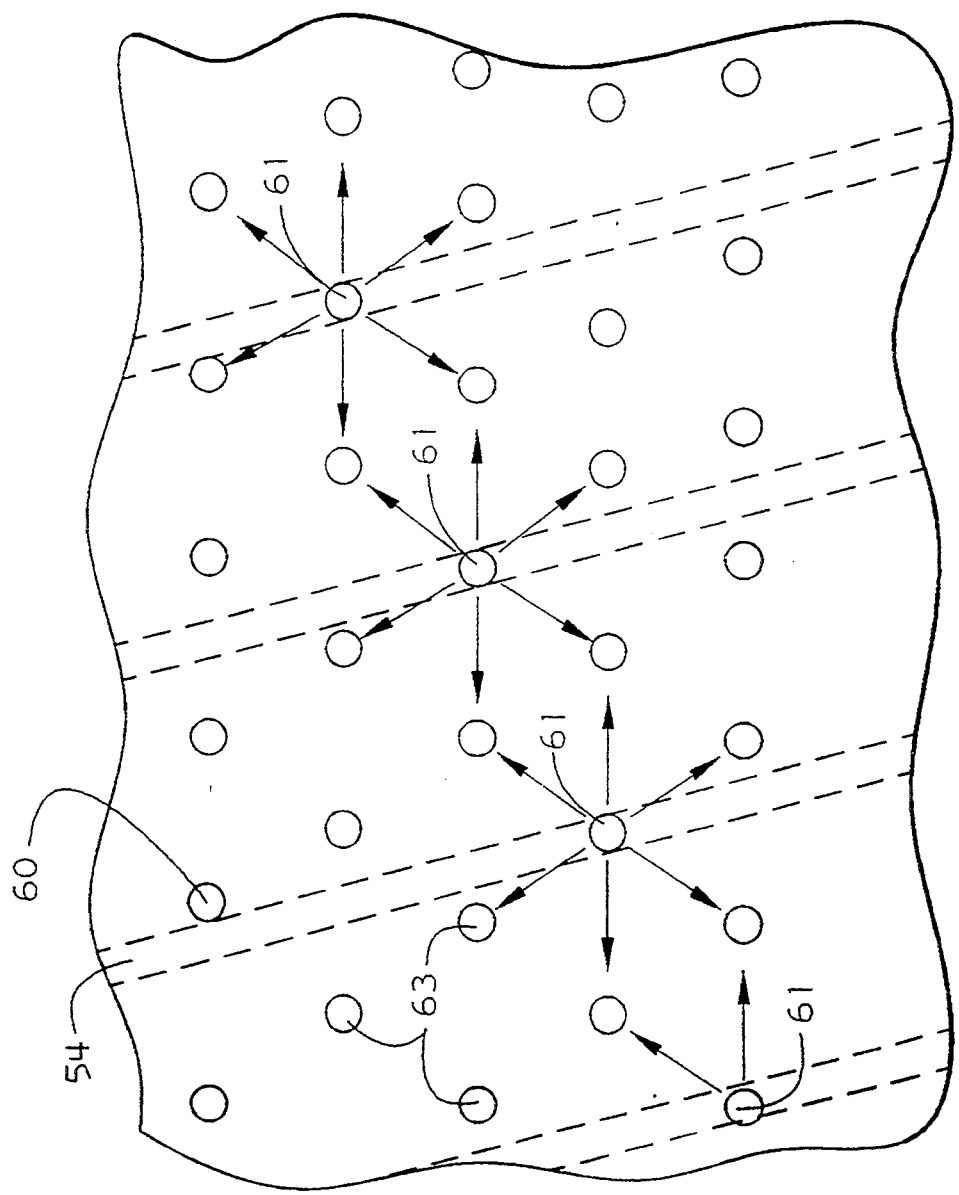
FIGS. 12–15 represent a sequential view the movement of the fluid supply assembly and the fluid supply channels relative to the apertures in the fluid injector mask.

The operation of an embodiment of the invention including the fluid flow assembly and the fluid injector mask is shown in FIGS. 12-15. In FIG. 12, the mask is shown in one position. The fluid will flow from the channels 54 in the fluid supply assembly into apertures 61 aligned with the supply channels at that time. The arrows emanating from the fluid jet injectors indicate the flow of fluid in all directions away from the apertures 61. The fluid will flow along the substrate, acting on the substrate as it moves along. The fluid will then flow through the apertures in the mask which are not aligned 63 with the supply channels at that time. As the fluid flows through the apertures, it is traveling the reverse direction as when it comes out of apertures. Thus, the fluid actually reverses its direction of travel through the apertures, unlike the embodiment including the fluid flow manifold in which fluid alternately does and does not flow through the fluid jet injectors.

Figure 13:
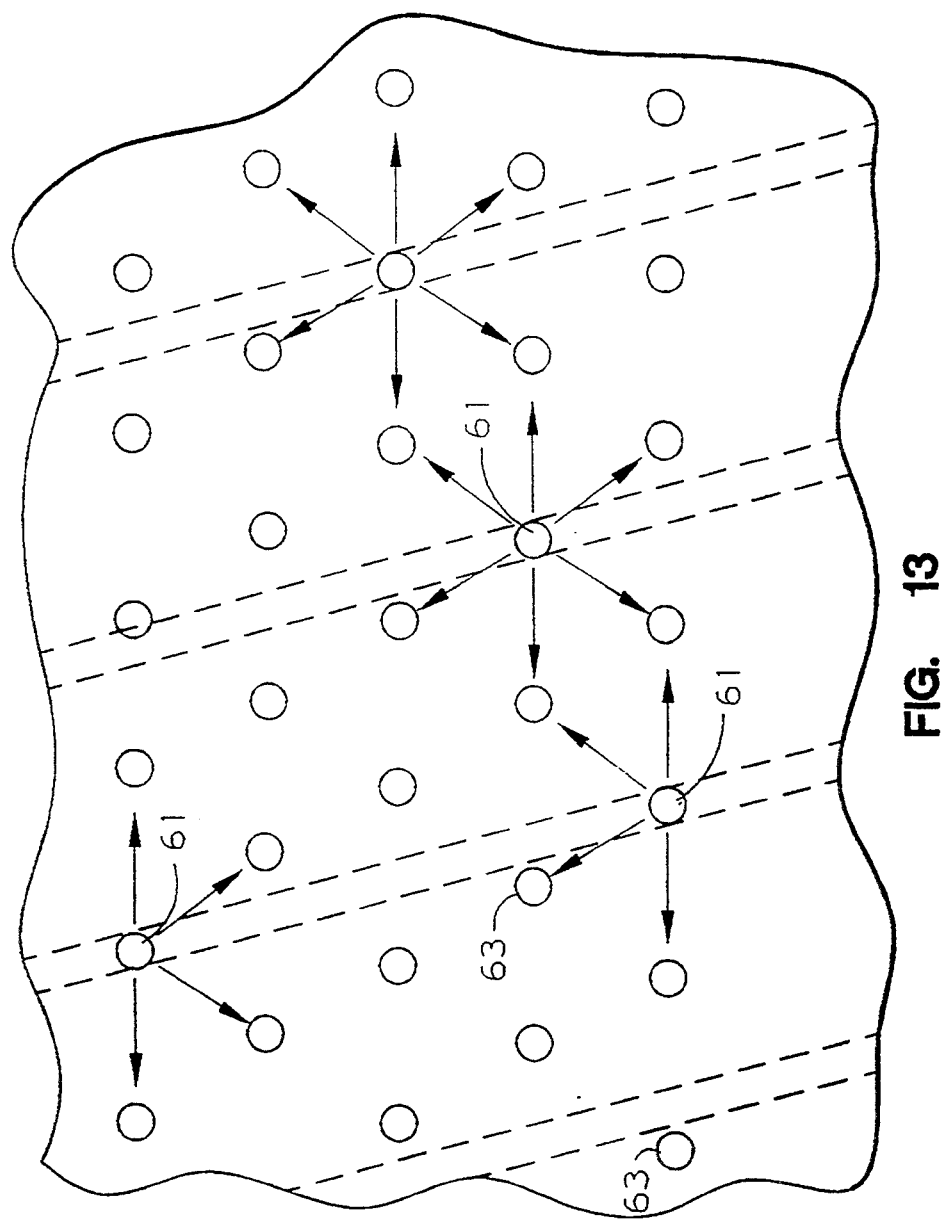
Figure 14:
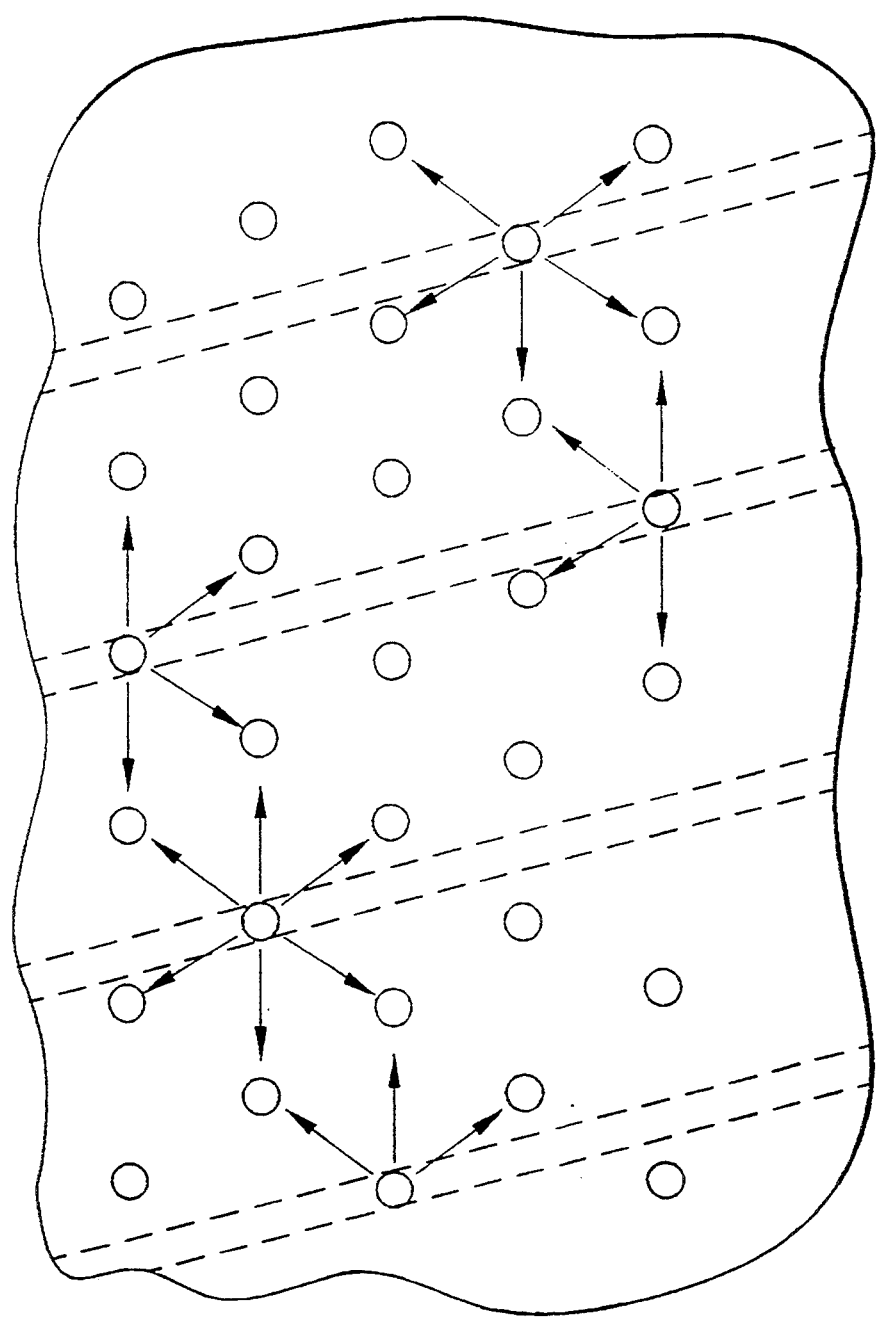
Figure 15:
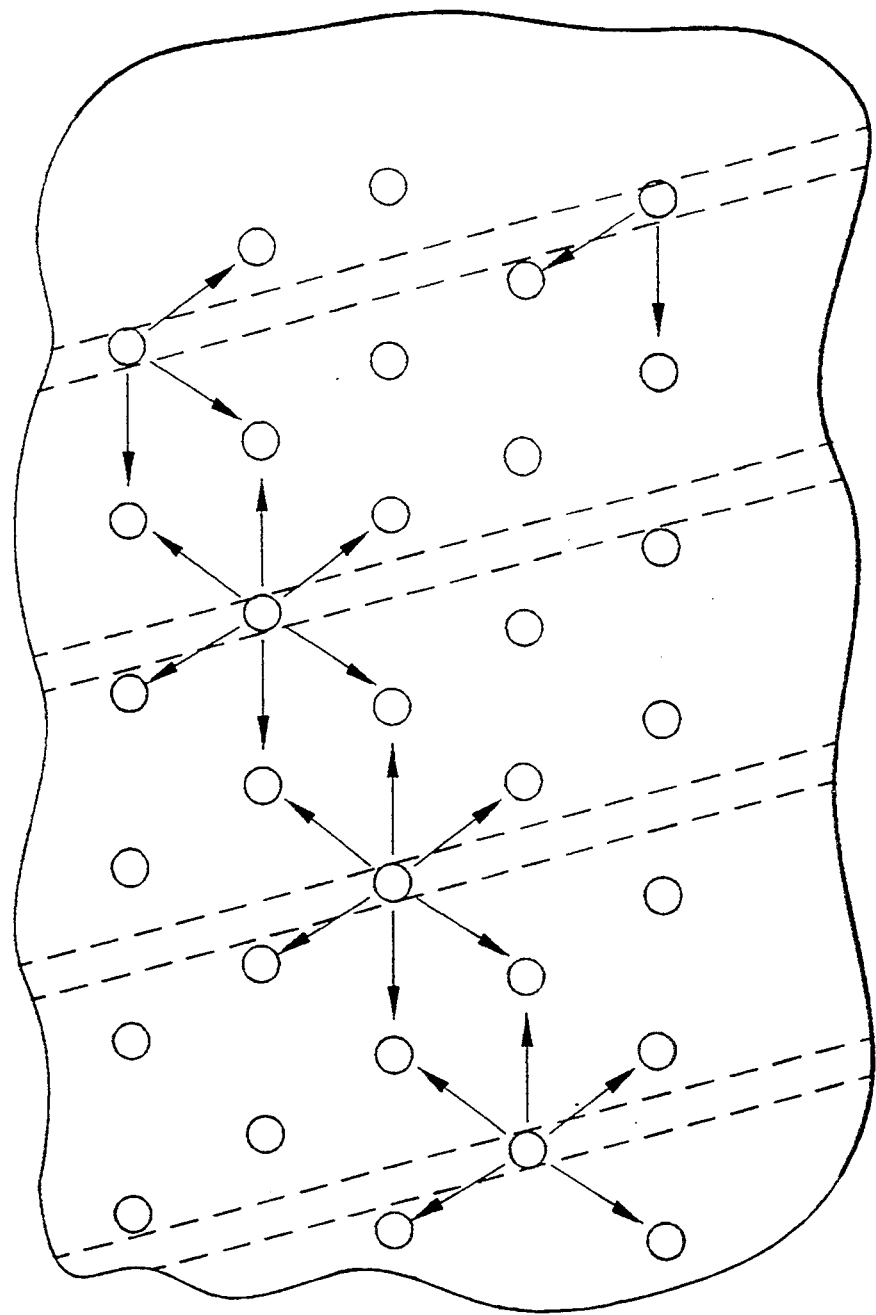

In FIG. 13, the injector mask has moved to the right enough to line up with a new set of apertures. In FIG. 13, it can be seen that the aperture which was aligned with the supply channel 54 in FIG. 12, which is the supply channel next to the left-most supply channel, is not aligned with the supply channel in FIG. 13. Therefore, in FIG. 13, that aperture will act as a drain passage at the time represented by FIG. 13. FIGS. 14 and 15 represent the apparatus as the mask has moved further to the right.

What is claimed is:

1. A fluid treatment apparatus, comprising:
   a first fluid flow manifold comprising at least one fluid head positioned a first surface of a substrate to be treated by a fluid, said first fluid flow manifold including at least two sets of a plurality of fluid jet injectors formed therein, means for directing a fluid into said fluid jet injectors, each of said fluid jet injectors creating a fluid jet impinging upon said substrate;
   means interconnected with said first fluid flow manifold for supplying said fluid to said fluid injector jets;
   means connected between said supply means and said first fluid flow manifold for alternating a flow of said fluid through said sets of fluid jet injectors; and
   a fluid source connected to said fluid supplying means.

2. A fluid treatment apparatus according to claim 1, wherein said fluid flow alternating means comprises a valve alternating said fluid flow between said sets of fluid jet injectors.

3. A fluid treatment apparatus according to claim 2, wherein said valve comprises a rotating valve, said rotating valve including at least two fluid flow paths alternatingly connecting said fluid supplying means with said sets of fluid jet injectors as said valve rotates.

4. A fluid treatment apparatus according to claim 2, wherein said rotating valve includes a first fluid flow path providing a connection between said fluid supplying means and a first set of fluid flow injectors when said rotating valve is in a first position and a second flow path providing a connection between a second set of fluid jet injectors and said fluid supplying means when said rotating valve is in a second position, said valve rotates in one direction.

5. A fluid treatment apparatus according to claim 2, further comprising:
   a second fluid flow manifold situated on an opposite side of said substrate from said first fluid flow manifold, said second fluid flow manifold comprising at least one fluid head positioned on a side of a substrate opposite said first fluid flow manifold, said second fluid flow manifold including at least two sets of a plurality of fluid jet injectors, means to receive a fluid and direct the fluid into said fluid jet injectors, each of said fluid jet injectors creating a fluid jet impinging upon said opposite side of said substrate;
   means interconnected with said second fluid flow manifold for supplying said fluid to said manifold;
   means connected between said supply means and said second fluid flow manifold for alternating a flow of said fluid through said sets of fluid jet injectors; and
   a fluid source connected to said fluid supplying means.

6. A fluid treatment apparatus according to claim 1, further comprising drain passages draining said fluid from about said substrate after said fluid has contacted said substrate, said drain passages being formed in said fluid flow manifold.

7. A fluid treatment apparatus according to claim 1, wherein said fluid jet injectors are arranged in rows with injectors from each manifold alternating within each row, a row of said drain passages is formed between each row of fluid jet injectors, and said drain passages are interdigitated with fluid jet injectors.

8. A fluid treatment apparatus according to claim 1, wherein said fluid flow manifold further comprises a third set of a plurality of fluid jet injectors, said fluid jet injectors of said two sets of fluid jet injectors are arranged in rows, said individual injectors of the two sets are alternatingly arranged within said rows, a row of fluid jet injectors of the third set alternatingly arranged with drain passages is arranged between rows of fluid jet injectors of said first two sets.

9. A fluid treatment apparatus according to claim 1, wherein said fluid supplying means comprises a pump.

10. A fluid treatment apparatus according to claim 1, wherein said fluid supplying means further comprises a fluid supply conduit connected between each of said fluid jet injector arrays and said rotating valve, each of said fluid supply conduits being connected to a plurality of branch fluid supply conduits connected to a fluid jet injector.

11. A fluid treatment apparatus according to claim 1, wherein said fluid flow manifold is a distance H from the surface of said substrate and said fluid jet injectors have a diameter D, with the ratio H/D ranging from about 0.2 to about 15.

12. A fluid treatment apparatus according to claim 1, wherein each of said fluid jets is characterized by a fluid speed, V, at said fluid jet injectors, and the fluid of said fluid jets is characterized by a kinematic viscosity, nu, and wherein a Reynolds number associated with each of said fluid jets, defined as the ratio V*D/nu, ranges from about 50 to about 30,000.

13. A fluid treatment apparatus according to claim 1, further comprising means draining fluid between said fluid flow manifold and the surface of the substrate, and means for recycling said fluid back into said fluid supplying means.

14. A fluid treatment apparatus according to claim 1, further comprising more that two fluid flow manifolds, each of said manifolds comprising at least one fluid head positioned adjacent a surface of said substrate, each of said fluid flow manifolds including at least two sets of a plurality of fluid jet injectors formed therein, each of said fluid jet injectors including means for receiving a fluid and directing the fluid into said fluid jet injectors, each of said fluid jet injectors creating a fluid jet impinging upon said substrate;
- means interconnected with each of said fluid flow manifolds for supplying said fluid to said sets of fluid jet injectors;
- means connected between said supply means and each of said fluid flow manifolds for alternating said flow of said fluid through said sets of fluid jet injectors; and
- a fluid source connected to said fluid supplying means.

15. A fluid treatment apparatus according to claim 1, further comprising means for collecting fluid drained from between said fluid flow manifold and said surface of said substrate and fluid flowing off of said substrate after interacting with said substrate.

16. A fluid treatment apparatus according to claim 1, wherein said fluid collecting means comprises a reservoir and wherein a pump pumps fluid in said reservoir into fluid supply conduits connected to said fluid jet injector arrays.

17. A fluid treatment apparatus, comprising:
- a first fluid supply assembly including a plurality of fluid supply channels formed therein and being located adjacent a first surface of a substrate to be treated;
- an injector mask interposed between said first fluid supply assembly and said substrate, said injector mask including a plurality of apertures formed therethrough, said injector mask selectively obstructing some of said fluid supply channels and allowing fluid to pass from said fluid supply channels to said substrate when a fluid supply channel is aligned with one of said apertures, said apertures forming said fluid into fluid jets;
- means for supplying fluid to said fluid supply assembly and to said fluid supply channels;
- a fluid source connected to said fluid supplying means; and
- means for moving said fluid supply assembly and said injector mask relative to each other whereby the fluid supply channels aligned with the apertures in the injector mask and the fluid supply channels obstructed by said injector mask may be altered.

18. A fluid treatment apparatus according to claim 17, wherein said injector mask is a distance H from the surface of said substrate and said apertures have a diameter D, with the ratio H/D ranging from about 0.2 to about 15.

19. A fluid treatment apparatus according to claim 17, wherein each of said fluid jets is characterized by a fluid speed, V, at said apertures, and the fluid of said fluid jets is characterized by a kinematic viscosity, nu, and wherein a Reynolds number associated with each of said fluid jets, defined as the ratio V*D/nu, ranges from about 50 to about 30,000.

20. A fluid treatment apparatus according to claim 17, wherein said apertures in said injector mask also act as drain passages, collecting spent fluid and carrying it to the drain channels between the slot injectors.

21. A fluid treatment apparatus according to claim 17, wherein said apertures in said injector mask have a shape comprising two frustoconical sections connected at a narrowest point by a cylindrical section, a widest point of said frustoconical sections intersecting an outer surface of said injector mask.

22. A fluid treatment apparatus according to claim 17, wherein said fluid jet assembly and said substrate are moved and said injector mask is stationary.

23. A fluid treatment apparatus according to claim 17, further comprising:
- a second fluid supply assembly including a plurality of fluid supply channels formed therein and being located adjacent a second surface of a substrate to be treated, said second surface being opposite said first surface;
- a second injector mask interposed between said second fluid supply assembly and said second surface substrate, said second injector mask including a plurality of apertures formed therethrough, said second injector mask selectively obstructing some of said fluid supply channels and allowing fluid to pass from said fluid supply channels to said second surface of said substrate when a fluid supply channel is aligned with one of said apertures;
- means for supplying fluid to said second fluid supply assembly and to said second fluid supply channels;
- a fluid source connected to said fluid supplying means; and
- means for moving said second fluid supply assembly and said second injector mask relative to each other whereby said fluid supply channels aligned with said apertures in the injector mask and the fluid supply channels obstructed by said second injector mask may be altered.

24. A fluid treatment apparatus according to claim 17, wherein fluid is supplied to said first fluid supply assembly and said second fluid supply assembly by one fluid source.

25. A fluid treatment apparatus according to claim 17, wherein said apertures are arranged in rows.

26. A method of treating a substrate with a fluid, comprising the steps of:
(a) providing a fluid treatment apparatus adjacent a surface of said substrate to be treated, said fluid treatment apparatus comprising at least one fluid flow manifold comprising at least one fluid head, said fluid flow manifold including at least two sets of a plurality of fluid jet injectors formed therein, means for directing the fluid into said fluid jet injectors, means interconnected with said first fluid flow manifold for supplying said fluid to said fluid injector jets, means connected between said supply means and said fluid flow manifold for alternating a flow of said fluid through said sets of fluid jet injectors, and a fluid source connected to said fluid supplying means;
(b) introducing a fluid into said fluid supply means;

(c) causing said fluid to flow alternately through one or more of said sets of said fluid jet injectors;

(d) causing said fluid to flow through said sets of fluid jet injectors through which fluid did not previously flow; and (e) draining fluid away from said fluid flow manifold and said substrate.

27. A method according to claim 26, wherein said fluid flow manifold is a distance H from the surface of said substrate and said fluid jet injectors have a diameter D, with the ratio H/D ranging from about 0.2 to about 15.

28. A method according to claim 26, wherein each of said fluid jets is characterized by a fluid speed, V, at said fluid jet injectors, and the fluid of said fluid jets is characterized by a kinematic viscosity, nu, and wherein a Reynolds number associated with each of said fluid jets, defined as the ratio V*D/nu, ranges from about 50 to about 30,000.

29. A method according to claim 26, wherein said fluid drained from said fluid flow manifold and said substrate is reintroduced into said fluid supply.

30. A method according to claim 26, further comprising the step of providing a fluid treatment apparatus adjacent a surface of said substrate to be treated, said fluid treatment apparatus comprising at least one fluid flow manifold comprising at least one fluid head, said fluid flow manifold including at least two sets of a plurality of fluid jet injectors formed therein, means for receiving a fluid and directing the fluid into said fluid jet injectors, means interconnected with said first fluid flow manifold for supplying said fluid to said fluid injector jets, means connected between said supply means and said fluid flow manifold for alternating a flow of said fluid through said sets of fluid jet injectors, and a fluid source connected to said fluid supplying means.

31. A method of treating a substrate with a fluid, comprising the steps of:

(a) locating a fluid supply assembly adjacent a surface of a substrate to be treated, said fluid supply assembly comprising a plurality of fluid supply channels formed therein;

(b) locating an injector mask between said fluid supply assembly and said surface of said substrate, said injector mask comprising a plurality of apertures formed therethrough;

(c) selectively obstructing some of said fluid supply channels and allowing fluid to pass from said fluid supply channels to said substrate by aligning a portion of said apertures in said injector mask with said fluid supply channels of said fluid supply assembly and blocking a remaining portion of said fluid supply channels;

(d) supplying fluid to said fluid supply assembly and to said fluid supply channels; and (e) altering the position of said fluid supply assembly and said injector mask relative to each other whereby the fluid supply channels aligned with the apertures in the injector mask and the fluid supply channels obstructed by said injector mask are altered.

32. A method according to claim 31, wherein said injector mask is a distance H from the surface of said substrate and said apertures have a diameter D, with the ratio H/D ranging from about 0.2 to about 15.

33. A method according to claim 31, wherein each of said fluid jets is characterized by a fluid speed, V, at said apertures, and the fluid of said fluid jets is characterized by a kinematic viscosity, nu, and wherein a Reynolds number associated with each of said fluid jets, defined as the ratio V*D/nu, ranges from about 50 to about 30,000.

34. A method of treating a substrate with a fluid according to claim 31, further comprising the step of draining from said fluid supply assembly, said injector mask and said surface of said substrate.

35. A method of treating a substrate with a fluid according to claim 34, further comprising the step of reintroducing said drained fluid into said fluid supply.

36. A method of treating a substrate with a fluid according to claim 31, further comprising:

the step of locating another fluid supply assembly adjacent another surface of said substrate, said other fluid supply assembly comprising a plurality of fluid supply channels formed therein;

locating another injector mask between said other fluid supply assembly and said other surface of said substrate, said other injector mask comprising a plurality of apertures formed therethrough;

selectively obstructing some of said fluid supply channels and allowing fluid to pass from said other fluid supply channels to said other surface of said substrate by aligning a portion of said apertures in said other injector mask with said other fluid supply channels of said other fluid supply assembly and blocking a remaining portion of said other fluid supply channels;

supplying fluid to said other fluid supply assembly and to said other fluid supply channels; and altering the position of said other fluid supply assembly and said injector mask relative to each other whereby the fluid supply channels aligned with the apertures in the injector mask and the fluid supply channels obstructed by said injector mask are altered.

* * * * *